(12) United States Patent  
Kato et al.

(10) Patent No.: US 8,817,542 B2  
(45) Date of Patent: Aug. 26, 2014

(54) NONVOLATILE SEMICONDUCTOR MEMORY DEVICE

(75) Inventors: Koji Kato, Yokohama (JP); Kazuhide Yoneya, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 345 days.

(21) Appl. No.: 13/425,881

(22) Filed: Mar. 21, 2012

(65) Prior Publication Data

US 2013/0077405 A1 Mar. 28, 2013

(30) Foreign Application Priority Data

Sep. 22, 2011 (JP) ................ P2011-208039

(51) Int. Cl.
*G11C 16/04* (2006.01)
(52) U.S. Cl.
CPC ..................................... *G11C 16/04* (2013.01)
USPC .................................................. 365/185.18
(58) Field of Classification Search
CPC ...................................................... G11C 16/04
USPC ...................................... 365/185.01–185.33
See application file for complete search history.

(56) References Cited

U.S. PATENT DOCUMENTS

| | | | |
|---|---|---|---|
| 7,529,131 B2 | 5/2009 | Iwai et al. | |
| 7,782,673 B2 | 8/2010 | Maejima et al. | |
| 2009/0159949 A1* | 6/2009 | Maejima et al. | 257/314 |
| 2009/0161439 A1* | 6/2009 | Aiika et al. | 365/185.23 |
| 2009/0244968 A1* | 10/2009 | Maejima | 365/185.03 |
| 2010/0195391 A1* | 8/2010 | Minamoto et al. | 365/185.05 |
| 2010/0214842 A1* | 8/2010 | Honda | 365/185.18 |
| 2011/0063917 A1* | 3/2011 | Shiino et al. | 365/185.17 |
| 2011/0176367 A1* | 7/2011 | Edahiro | 365/185.17 |
| 2012/0206968 A1* | 8/2012 | Shiino et al. | 365/185.17 |
| 2013/0077405 A1* | 3/2013 | Kato et al. | 365/185.18 |

FOREIGN PATENT DOCUMENTS

JP 2009-146556 7/2009

* cited by examiner

*Primary Examiner* — Harry W Byrne
(74) *Attorney, Agent, or Firm* — Oblon, Spivak, McClelland, Maier & Neustadt, L.L.P.

(57) ABSTRACT

A nonvolatile semiconductor memory device in an embodiment includes a semiconductor layer, a memory cell array, word lines, bit lines, a source line, and a control circuit. The memory cell array has memory strings, each of the memory strings having memory cells. The word lines are connected to the control gates of the memory cells. The control circuit controls a voltage applied to the semiconductor layer, the control gates, the bit lines, and the source line. When executing a read operation, the control circuit begins application of a first voltage to the source line at a first time, the first voltage having a positive value. The control circuit begins application of a second voltage to unselected word lines at the first time or thereafter, the second voltage setting the memory cells to a conductive state regardless of retained data of the memory cells.

15 Claims, 6 Drawing Sheets

Lower Page PRG

Upper Page PRG

(Negative Sense Scheme)

Negative Sense

NONVOLATILE SEMICONDUCTOR MEMORY DEVICE

CROSS REFERENCE TO RELATED APPLICATION

This application is based upon and claims the benefit of priority from prior Japanese Patent Application No. 2011-208039, filed on Sep. 22, 2011, the entire contents of which are incorporated herein by reference.

BACKGROUND

1. Field

This invention relates to a nonvolatile semiconductor memory device.

2. Description of the Related Art

In NAND cell type flash memory, due to progress in the likes of shrinking of memory cells and multi-value technology for storing multiple data in a single memory cell, a voltage value of a lower limit of a threshold voltage distribution after execution of a data erase operation is attaining an increasingly low value (negative value of large absolute value). In the case of memory cells in an erase state having such a threshold voltage distribution of low voltage value, even if a write operation of data is performed on the memory cell, the threshold voltage distribution after write sometimes does not reach a positive value but remains a negative value.

Thus, the idea of setting to a negative value the voltage applied to the control gate of a selected memory cell during a read operation is also being studied. However, preparing a voltage of negative value as a voltage to be applied to the control gate requires a special voltage generating circuit, which leads to an increase in circuit area and an increase in power consumption.

Then, a NAND cell type flash memory system applies a positive voltage to a source line and a well (semiconductor layer where memory cells are formed), thereby no need to set to a negative voltage a read voltage applied to the control gate of a selected memory cell (below, such a system is referred to as a "negative sense scheme"). This negative sense scheme does not need a voltage generating circuit for generating a negative voltage for the control gate (word line) and enables increase in circuit area to be suppressed.

DETAILED DESCRIPTION

A nonvolatile semiconductor memory device in an embodiment described below includes a semiconductor layer, a memory cell array, word lines, bit lines, a source line, and a control circuit. The memory cell array has memory strings, each of the memory strings having a plurality of memory cells connected in series, each of the memory cells including a charge accumulation layer formed on the semiconductor layer via a gate insulating film and a control gate formed on the charge accumulation layer via an inter-gate insulating film. The word lines are connected to the control gates. The bit lines are electrically connected to one ends of the memory strings. The source line is electrically connected to the other ends of the memory strings. The control circuit is configured to control a voltage applied to the semiconductor layer, the control gates, the bit lines, and the source line.

When executing a read operation, the control circuit is operative to begin application of a first voltage to the source line at a first time, the first voltage having a positive value. The control circuit is operative to begin application of a second voltage to at least one of unselected word lines at the first time or thereafter, the unselected word lines being the word lines connected to unselected memory cells which are the memory cells other than a selected memory cell selected from among the plurality of memory cells, the second voltage setting the memory cells to a conductive state regardless of retained data of the memory cells.

Next, embodiments of the present invention are described in detail with reference to the drawings.

First Embodiment

Figure 1:
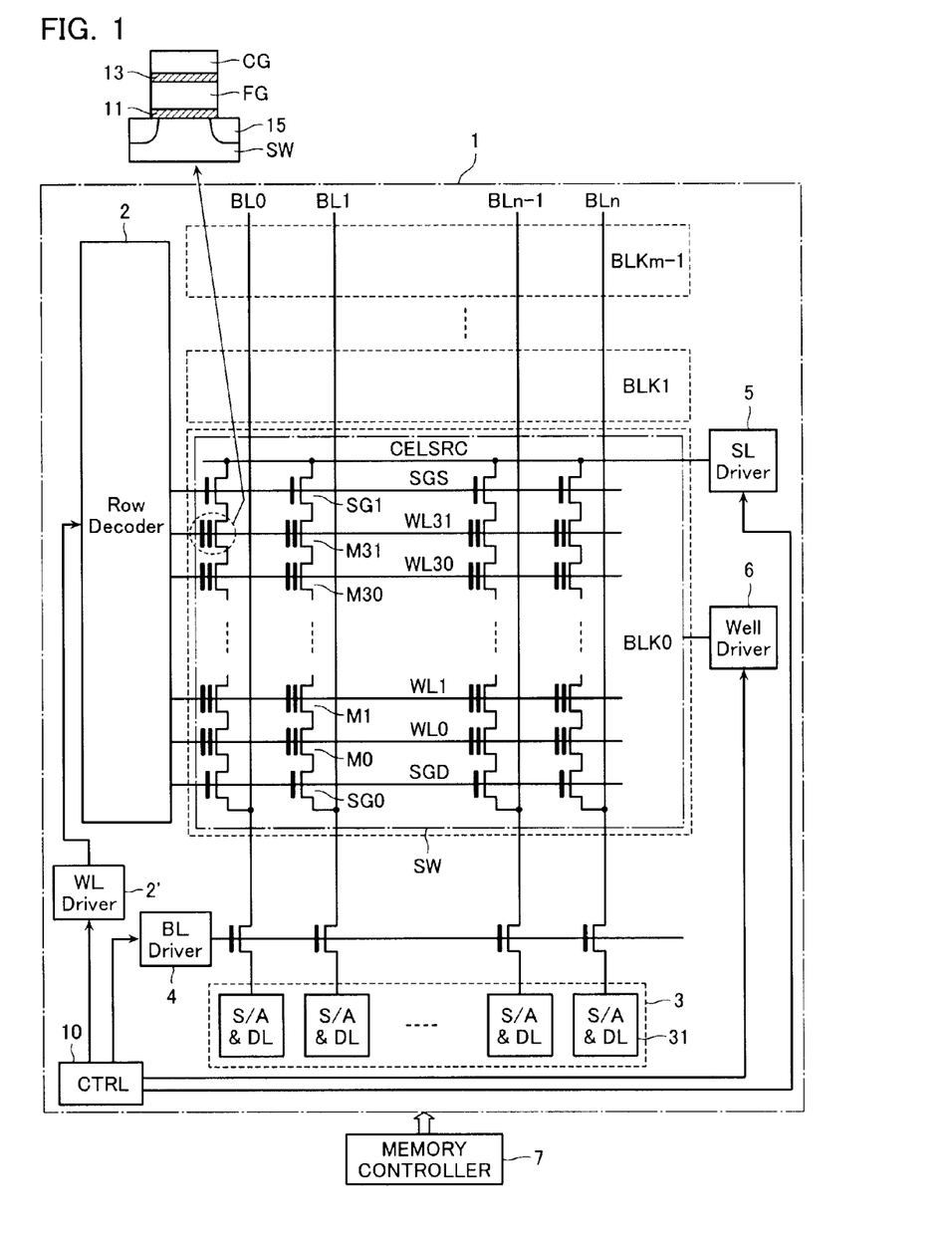
FIG. 1 is a circuit diagram explaining a memory core configuration in a NAND cell type flash memory according to a first embodiment.

First, a NAND cell type flash memory in a first embodiment is described with reference to FIG. 1. FIG. 1 shows a memory core configuration in the NAND cell type flash memory according to the first embodiment.

A memory cell array 1 is configured having a plurality of memory strings MS arranged therein, each of the memory strings MS having 32 electrically rewritable nonvolatile memory cells M0-M31 connected in series. The number of memory cells M in one memory string MS is not limited to 32, and may be set to, for example, 64, 128, and so on. Connected to both ends of the memory string MS are a drain side select gate transistor SG0 and a source side select gate transistor SG1 which are conductive when that memory string MS is selected. These 32 memory cells M0-M31 and the select gate transistors SG0 and SG1 configure one NAND cell unit.

A floating gate type memory cell may be adopted as the memory cell M. This floating gate type memory cell is of a type having a floating gate FG (charge accumulation layer) formed via a gate insulating film 11 on a p-type well SW formed on a semiconductor substrate, and including a control gate CG on this floating gate FG via an inter insulating film 13. In addition, a plurality of memory cells M connected in series in one memory string MS share a drain/source diffusion layer 15. A MONOS type memory cell including a charge accumulation layer configured from, for example, a silicon nitride film or the like may also be adopted in place of the floating gate type of memory cell.

Each NAND cell unit is connected to a bit line BL by one end of the drain side select gate transistor SG0 and is connected to a source line CELSRC by one end of the source side select gate transistor SG1.

Control gates of the memory cells M0-M31 in the NAND cell unit are respectively connected to different word lines WL0-WL31. Gates of the select gate transistors SG0 and SG1 are connected to select gate lines SGD and SGS parallel to the word lines WL0-WL31.

A row decoder 2 and a word line driver 2' are disposed to select and drive the word lines WL and the select gate lines SGD and SGS. Each of the bit lines BL is connected to a sense amplifier and data latch 31 in a sense amplifier circuit 3. The bit line BL is charged to a certain voltage (for example, 1.5 V-2.5 V) in a read operation, by a pre-charge circuit not shown which is included in the sense amplifier and data latch 31. Moreover, a clamp transistor is connected between the bit line BL and the sense amplifier and data latch 31, and a gate voltage of this clamp transistor is controlled by a bit line driver 4.

Now, the case is shown in which the bit lines BL are connected to the sense amplifier and data latches 31 in a one-to-one correspondence, and in this case, the memory cells selected by one word line WL configure one page subject to a simultaneous write or read. However, a system may also be adopted in which, for example, adjacent even-numbered bit lines and odd-numbered bit lines share one sense amplifier and data latch. In this case, half of the memory cells selected by one word line configure a unit of simultaneous write or read (one page).

A block which is a unit of data erase includes NAND cell units sharing word lines. As shown in FIG. 1, a plurality of blocks BLK0, BLK1, . . . , BLKm−1 are arranged in a direction of the bit lines BL.

In addition, a source line driver 5 and a well driver 6 are provided as circuits for controlling a potential of the source line CELSRC and the well SW. The source line driver 5 and the well driver 6, when executing the above-mentioned negative sense scheme, raise voltages of the source line CELSRC and the well SW to, respectively, a voltage $V_{CELSRC}$ (>0) and a voltage $V_{well}$ ($V_{well}$>0, $V_{CELSRC} \geq V_{well}$). To avoid current flowing from the well SW to the source line CELSRC, the voltage $V_{well}$ is set to a voltage equal to the voltage $V_{CELSRC}$ or smaller than the voltage $V_{CELSRC}$. A control circuit 10 controls these drivers 2', 4, 5, and 6 according to a command and data from, for example, a memory controller 7. The control circuit 10 controls these drivers 2', 4, 5, and 6 to control voltages applied to the word lines WL, the bit lines BL, the source line CELSRC, and the well SW. Note that the voltages supplied to the word lines WL, the bit lines BL, the source line CELSRC, and the well SW are supplied from a voltage generating circuit 7. The voltage generating circuit 7 comprises a plurality of boost circuits CP. The voltage generating circuit 7 selectively operates some of this plurality of boost circuits (power supply circuits) CP in accordance with a control signal from the control circuit 10. In addition, the voltage generating circuit 7 is configured capable of simultaneously supplying voltages generated using some of this plurality of boost circuits CP to a plurality of the drivers 2', 4, 5, or 6. That is, the control circuit 10 in the present embodiment is configured capable of, in some cases, supplying an identical voltage to various kinds of drivers using identical boost circuits CP.

Figure 2:
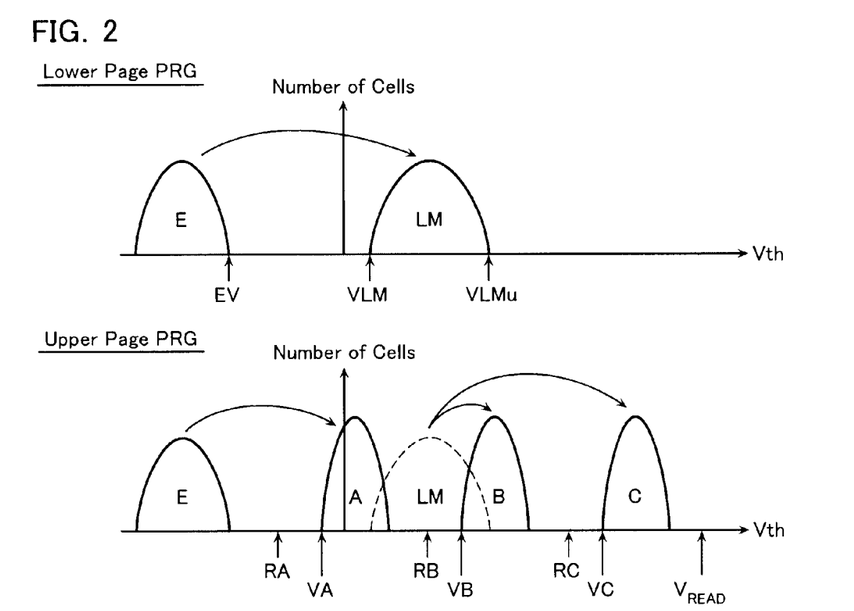
FIG. 2 shows one example of a method of data write when a four-value data storage system is executed in the NAND cell type flash memory of the first embodiment.
Figure 3:
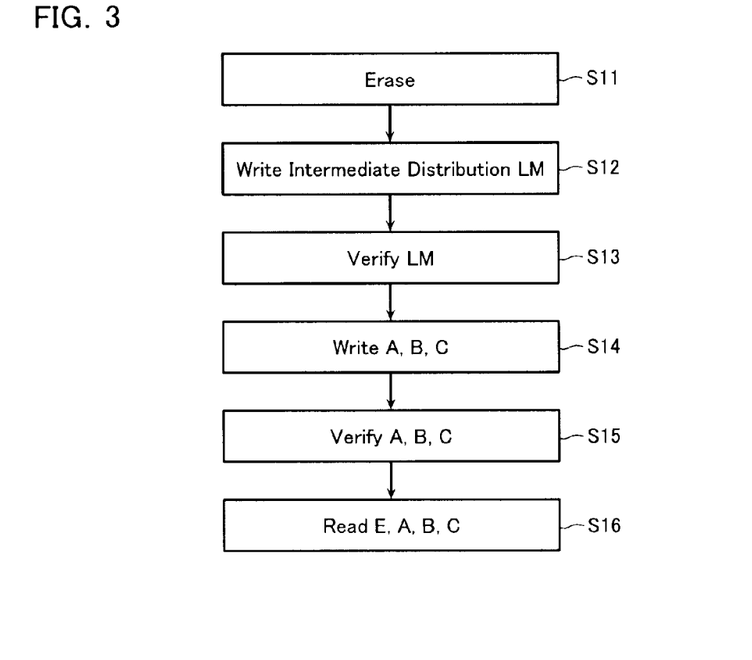
FIG. 3 is a flowchart showing a procedure when a method of write in FIG. 2 is executed.

FIG. 2 shows one example of a method of data write when a four-value data storage system is executed in the NAND cell type flash memory of this embodiment. In addition, FIG. 3 is a flowchart showing a procedure when this method of write is executed. The four-value data is specified by, for example, a negative threshold voltage distribution (erase distribution) E in which voltage level is at a lowest level, and threshold voltage distributions A, B, and C at voltage levels larger than this lowest level.

To write this four-value data, first, all memory cells in a selected block are set to the lowest of the threshold voltage distributions, namely, the negative threshold voltage distribution E (data erase: step S11 in FIG. 3). This data erase is performed by providing a positive erase voltage Vera from the well driver 6 to the well SW on which the memory cell array 1 is formed, and setting all word lines of the selected block to 0 V, thereby discharging electrons of the charge accumulation layers of all the memory cells M.

Next, a lower page write (Lower Page Program) is performed in which some of the cells having the threshold voltage distribution E are written to an intermediate distribution LM (step S12 in FIG. 3). Then, a verify operation for determining completion of write to the intermediate distribution LM is performed, by setting a verify voltage to a voltage VLM (applying a voltage VLM between gate and source of a selected memory cell M) (step S13).

Subsequently, an upper page write (Upper Page Program) is performed to raise a threshold voltage from the threshold voltage distribution E to A, and from the intermediate distribution LM to the threshold voltage distributions B and C (step S14). Then, a verify operation is performed using voltages VA, VB, and VC as verify voltages (step S15). After write to all the threshold voltage distributions E-C has been completed in this way, a read operation is performed as required (step S16). In the read operation, a read voltage applied between gate and source of the selected memory cell M is set to read voltages RA, RB, and RC which are voltages between an upper limit and a lower limit of each of the threshold voltage distributions E-C, while a read pass voltage $V_{READ}$ sufficiently larger than an upper limit value of the threshold voltage distribution C is applied between gate and source of unselected memory cells. The read pass voltage $V_{READ}$ is a voltage capable of setting the memory cell M to a conductive state regardless of retained data of the memory cell M.

The above data write is performed as an operation that provides a write voltage VPGM to the selected word line, provides a write pass voltage Vpass to the unselected word lines, and provides, for example, a ground voltage Vss (in the case of "0" write raising the threshold voltage) or a power supply voltage Vdd (in the case of write inhibit not raising the threshold voltage) to the bit lines BL, thereby selectively injecting electrons into the charge accumulation layers of the memory cells.

That is, in the case of "0" write, the ground voltage Vss provided to the bit lines BL is transferred to a channel of the NAND cell unit, and, when the write voltage VPGM is provided, electrons are injected from the channel into the floating gate due to a tunnel current. On the other hand, in the case of "1" write (write inhibit), the NAND cell channel is charged to Vdd-Vt (Vt is a threshold voltage of the drain side select gate transistor SG0) and then brought into floating. When the write voltage VPGM is provided, the cell channel is boosted by capacitive coupling, whereby electron injection hardly occur. Note that it is usual in data write to employ a step-up write system that raises the write voltage little by little every write cycle (write operation and write verify operation).

In lower page write (write of the intermediate distribution LM), confirmation of write state (a verify operation) is performed to set a lower limit of a threshold voltage of the intermediate distribution LM to not less than a certain voltage (verify voltage VLM). That is, in a verify read operation where the verify voltage VLM is provided between the control gate (selected word line) and source of the selected memory cell, a judgment of write failure (fail) is made if the selected memory cell becomes conductive, and a judgment of write success (pass) is made if the selected memory cell does not become conductive. Similarly, during upper page write, write verify operations of data states A, B, and C are performed using the verify voltages VA, VB, and VC, respectively.

In NAND cell type flash memory, due to progress in shrinking of memory cells, multi-value storage technology, and so on, has resulted in a voltage value of the threshold voltage distribution E after execution of a data erase operation attaining an increasingly low value (negative value of large absolute value). In the case that a write operation of data is performed on a memory cell in an erase state having such a threshold voltage distribution of low voltage value, a lower limit of the threshold voltage distribution after write sometimes does not reach a positive value but remains a negative value. FIG. 2 shows an example where a lower limit value of the threshold voltage distribution A has a negative value.

In this case, a voltage of negative value is provided between the gate and source of the selected memory cell Mn during the verify operation, but preparing a voltage generating circuit capable of providing a voltage of negative value to the control gates of the memory cells leads to an increase in circuit area. Hence, the present embodiment adopts the above-mentioned negative sense scheme.

Figure 4:
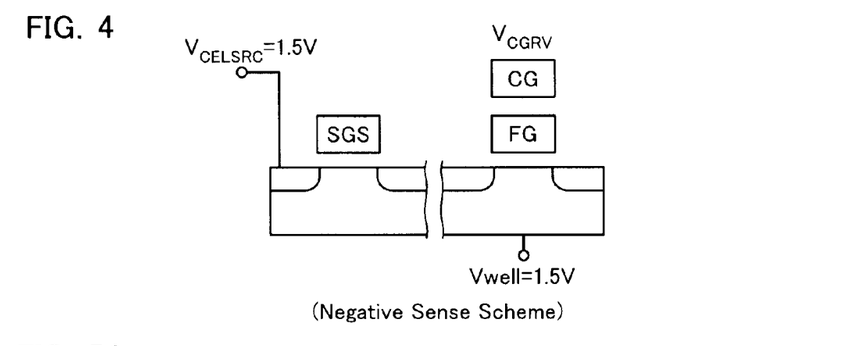
FIG. 4 is a schematic view of a so-called negative sense scheme.

In the negative sense scheme, during the read operation and verify read operation, the voltage $V_{CELSRC}$ and the voltage $V_{well}$ applied to the source line CELSRC and the well SW are set to a voltage of positive value, for example, a voltage of about 1.5V (refer to FIG. 4). In this case, if the verify voltage VA of the threshold voltage distribution A is, for example, −1.5 V, it is sufficient for a voltage $V_{CGRV}$ applied to the control gate of the selected memory cell during this write verify operation of the threshold voltage distribution A to be 0 V (=−1.5+1.5). In this way, the negative sense scheme makes it unnecessary to set a voltage applied to the control gate of the selected memory cell to a negative voltage even if the lower limit value of the threshold voltage distribution is set to a negative voltage.

Note that in the case where only the lower limit value of the threshold voltage distribution A is a negative value and lower limit values of the other threshold voltage distributions B and C are positive values as in FIG. 2, the above-mentioned negative sense scheme may be adopted only in the verify operation and read operation for the threshold voltage distribution A. That is, a configuration may be adopted where the read operations for the threshold voltage distributions B and C are executed by an ordinary read system setting the voltages $V_{CELSRC}$ and $V_{well}$ to 0 V, without relying on the negative sense scheme. However, the negative sense scheme may be executed also on the threshold voltage distributions B and C. The embodiments mentioned hereafter describe the case where all the read operations, including those for the threshold voltage distributions B and C, are executed by the negative sense scheme, but the embodiments are not limited to this.

Next, a read operation in the NAND cell type flash memory of the first embodiment using the negative sense scheme is described with reference to FIG. 5A. In the read operation using the negative sense scheme in the present embodiment, the source line CELSRC and the well SW are provided with a positive voltages $V_{CELSRC}$ and $V_{well}$. Moreover, one of the memory cells M0-M31 configuring the memory string MS is selected as a selected memory cell Ms, and has its control gate (selected word line WLs) applied with a read voltage $V_{CGRV}$. Since the source line CELSRC and the well SW are provided with the positive voltages $V_{CELSRC}$ and $V_{well}$ then, as shown as an example in FIG. 5, the voltages $V_{CGRV}$ can be set to voltages RAn, RBn, and RCn which are all 0 V or more. That is, even if at least a portion of the threshold voltage distributions A, B, and C is present in a negative region as shown in FIG. 2, the fact that the source line CELSRC and the well SW are provided with the positive voltages $V_{CELSRC}$ and $V_{well}$ makes it possible to obtain a state where the voltages VA, VB, and VC are shifted in the positive direction (voltages VAn, VBn, and VCn). At least two or more memory cells except for the selected memory cell Ms are assumed to be unselected memory cells Mns, and have their control gates (unselected word lines WLns) applied with a voltage $V_{READ}+V_{CELSRC}$.

When start of the read operation is instructed, the control circuit 10 controls the drivers 2', 4, 5, and 6 to control voltages applied to the word lines WL, the bit lines BL, the source line CELSRC, and the well SW.

Figure 5A:
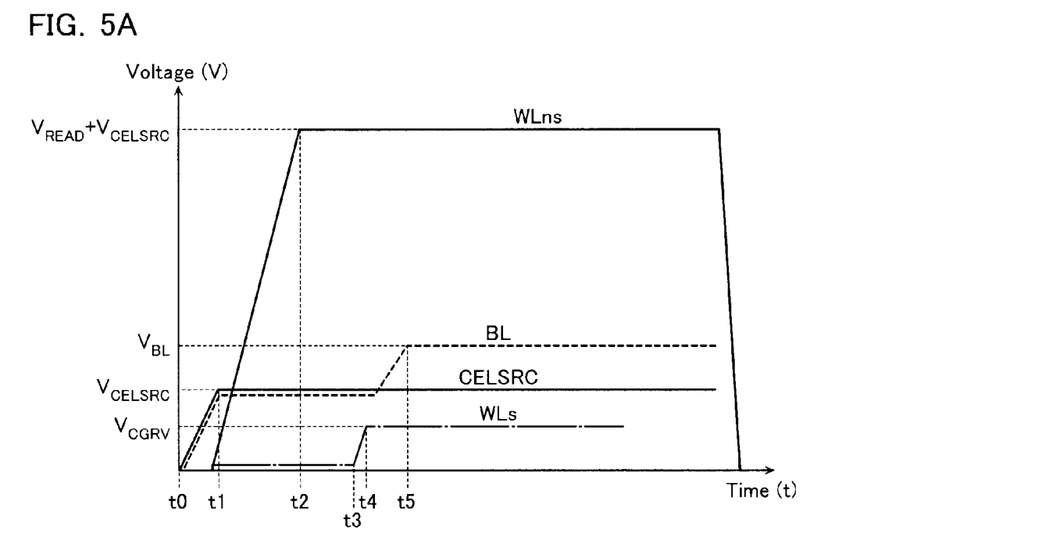
FIG. 5A is a timing chart showing a read operation in the NAND cell type flash memory of the first embodiment.
Figure 5B:
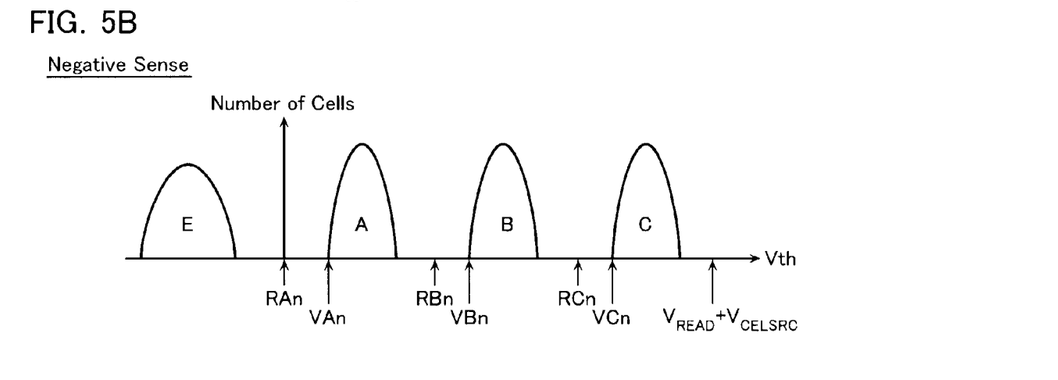
FIG. 5B is a schematic view showing a read operation using the negative sense scheme executed in the NAND cell type flash memory of the first embodiment.

In FIG. 5A, a potential of the source line CELSRC reaches a voltage $V_{CELSRC}$ (for example, about 1 V) at time t1. Then, at time t1, the control circuit 10 controls the drivers 2', 4, 5, and 6 to begin application of a voltage to the unselected word lines WLns and thereby cause a potential of the unselected word lines WLns to reach the voltage $V_{READ}+V_{CELSRC}$ at time t2. In this way, in the present embodiment, application of voltage to the unselected word lines WLns is started after the source line CELSRC has been brought to the voltage $V_{CELSRC}$. By doing so, a voltage stress $V_{stress}$ applied to unselected memory cells Mns is $V_{stress} \leq V_{READ} = (V_{READ}+V_{CELSRC})-(V_{CELSRC})$ even if the voltage of the unselected word lines WLns is raised continuously and linearly from 0 V to the voltage $V_{READ}+V_{CELSRC}$ as in FIG. 5A. That is, the voltage stress $V_{stress}$ applied to the unselected memory cells Mns does not exceed the voltage $V_{READ}$. Note that a time when application of voltage to the unselected word lines WLns begins need not be time t1 and need only be a time later than time t0. However, it is preferable to control such that application of voltage to the unselected word lines WLns is begun at a time later than time t1 when the voltage of the source line CELSRC reaches the voltage $V_{CELSRC}$.

On the other hand, the control circuit 10 controls the drivers 2', 4, 5, and 6 to control such that a potential of the selected word line WLs is raised from time t3 and reaches a certain voltage $V_{CGRV}$ at time t4. The bit lines BL reach a voltage $V_{BL}$ (>$V_{CELSRC}$, for example, about 1.5 V) at an even later time of time t5, due to control of the control circuit 10. Then, the select transistors SG0 and SG1 are set to a conductive state to start the read operation.

It is possible to suppress read disturb in the read operation in the present embodiment even when the negative sense scheme is adopted. Now, to explain advantages of the first embodiment, a comparative example of the first embodiment is described with reference to FIG. 6.

Figure 6:
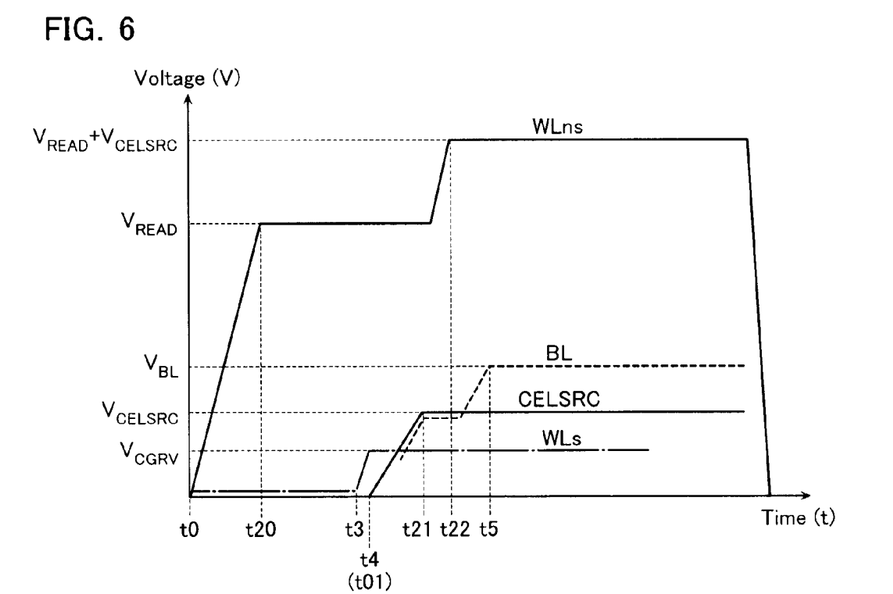
FIG. 6 is a timing chart showing a read operation in a NAND cell type flash memory of a comparative example.

In this comparative example, unlike in the first embodiment (FIG. 5), the control circuit first begins to apply a voltage to the unselected word lines WLns at time t0 and causes the potential of the unselected word lines WLns to reach the voltage $V_{READ}$ at time t20. Subsequently, the control circuit begins application of voltage to the selected word line WLs at time t3, thereby causing the potential of the selected word line WLs to reach the voltage $V_{CGRV}$ at time t4.

In addition, the control circuit begins to apply a voltage to the source line CELSRC at time t01. Subsequently, the control circuit causes the potential of the source line CELSRC to reach the voltage $V_{CELSRC}$ at time t21, and causes the potential of the unselected word lines WLns to reach the voltage $V_{READ}+V_{CELSRC}$ at time t22. Furthermore, the control circuit causes the potential of the bit lines BL to reach the voltage $V_{BL}$ at time t5.

In this comparative example, as shown in FIG. 6, time t01 when a voltage begins to be applied to the source line CELSRC is later than time t0 when the voltage $V_{READ}$ begins to be applied to the unselected word lines WLns. Therefore, in this comparative example, the time when the voltage of the unselected word lines WLns is raised from the voltage $V_{READ}$ to the voltage $V_{READ}+V_{CELSRC}$ is set to be a time later than time t21 when the voltage of the source line CELSRC reaches the voltage $V_{CELSRC}$. Because of this, applying a voltage stress $V_{stress}$ of voltage $V_{READ}$ or more to the unselected memory cells Mns is avoided. As a result of this operation, the voltage stress $V_{stress}$ of the unselected memory cells Mns is always less than the voltage $V_{READ}$. However, a time that the read pass voltage $V_{READ}$ is applied to the unselected memory cells Mns before the read operation is long. That is, stress applied to the unselected memory cells Mns during a period from time t20 to time t3 is large compared to in the first embodiment. Moreover, such a long stress time that the read pass voltage $V_{READ}$ is applied increases a possibility of read disturb occurring.

In contrast, in the present embodiment, at time t2 when the potential of the unselected word lines WLns reaches $V_{READ}+V_{CELSRC}$, the potential of the source line CELSRC has already reached the voltage $V_{CELSRC}$. Therefore, a time during which a voltage of about the read pass voltage $V_{READ}$ is applied unnecessarily to the unselected memory cells Mns is shortened compared to in FIG. 6. This reduces the possibility of read disturb. As a result, reliability of the NAND cell type flash memory can be improved.

Additionally in the present embodiment, a time from time t20 to time t22 can be shortened compared to in the comparative example. That is, the unselected word lines WLns are raised in one shot to $V_{READ}+V_{CELSRC}$, without once stopping at the voltage $V_{READ}$. As a result, a write operation time accompanied by a verify operation can be reduced.

Modified Example of First Embodiment

Figure 7A:
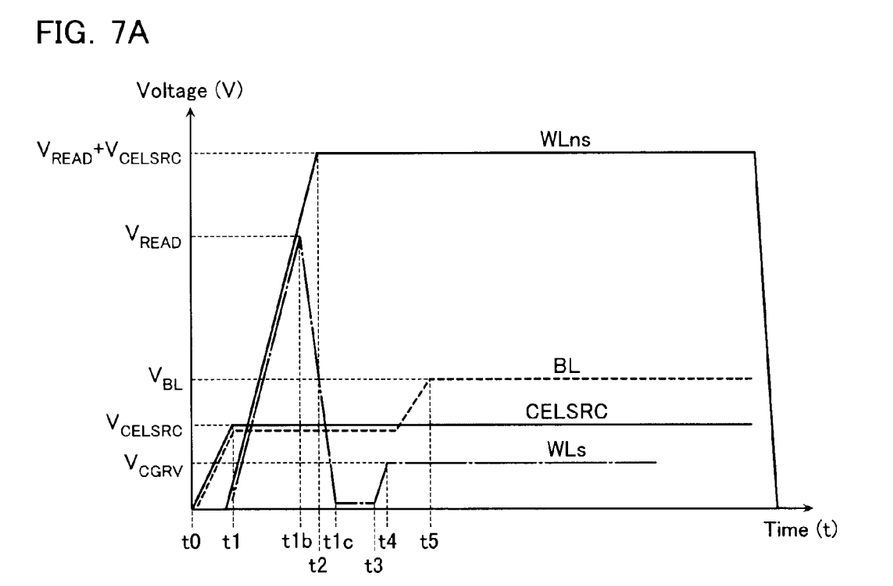
FIG. 7A is a timing chart showing a read operation in a NAND cell type flash memory according to a modified example of the first embodiment.

First, a NAND cell type flash memory in a modified example of the first embodiment is described with reference to FIG. 7A. A memory configuration is similar to that of the first embodiment. This modified example differs from the first embodiment in adding to the first embodiment a spike operation which is performed on the selected word line WLs.

The control circuit 10 controls the drivers 2', 4, 5, and 6 to begin applying a voltage also to the selected word line WLs almost simultaneously to beginning applying a voltage to the unselected word lines WLns at time t1. Subsequently, the potential of the selected word line WLs, after being raised to the voltage $V_{READ}$ at time t1b, is lowered again to 0 V at time t1c. The operation on the selected word line WLs from time t1 to time t1c is termed a spike operation. Subsequent operation on the selected word line WLs is similar to that in the first embodiment. In this way, the spike operation has an aim that a channel of the selected memory cell is not cut at a timing when the unselected word lines WLns are raised to $V_{READ}$. This results in avoiding a locally electric field concentration in a vicinity of the selected memory cell and results in an increase in probability of an erroneous write in a memory cell adjacent to the selected memory cell.

The read operation in the present example allows time for the read operation to be reduced compared to in the first embodiment. Now, for explanation of advantages of the modified example of the first embodiment, a comparative example is described with reference to FIG. 7B.

Figure 7B:
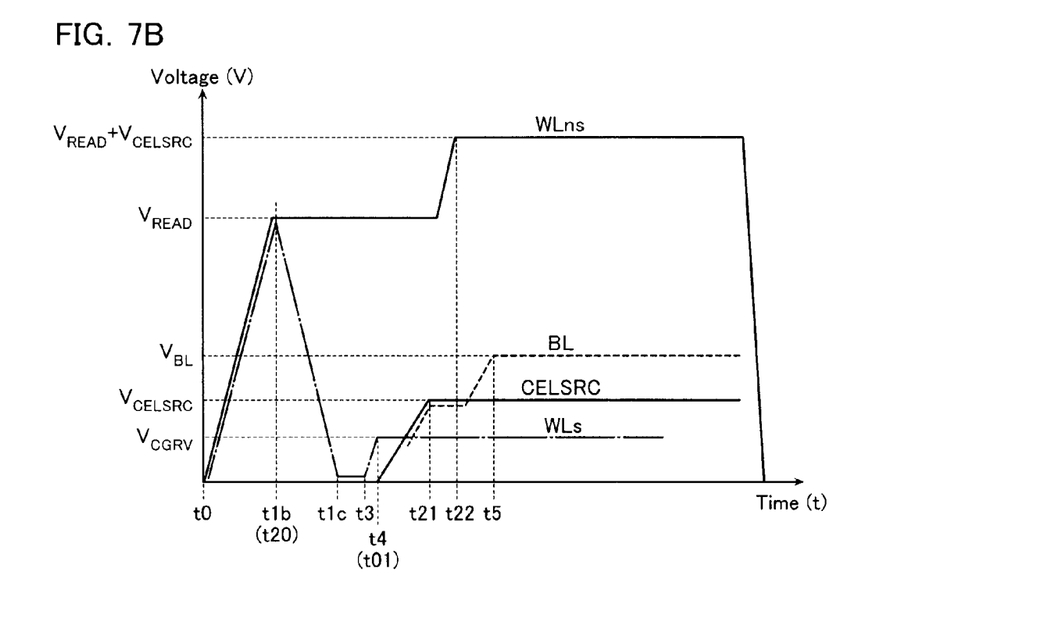
FIG. 7B is a timing chart showing a read operation in a NAND cell type flash memory of a comparative example of the modified example of the first embodiment.

As shown in FIG. 7B, in this comparative example, the control circuit 10 applies a voltage to the source line CELSRC at time t01 which is after time t1c when the spike operation has finished.

In contrast, in the modified example of the first embodiment, similar advantages to those in the first embodiment can be obtained. Furthermore, adding the spike operation allows reliability of the NAND cell type flash memory to be improved and the read operation to be shortened.

Another Modified Example of First Embodiment

Figure 8:
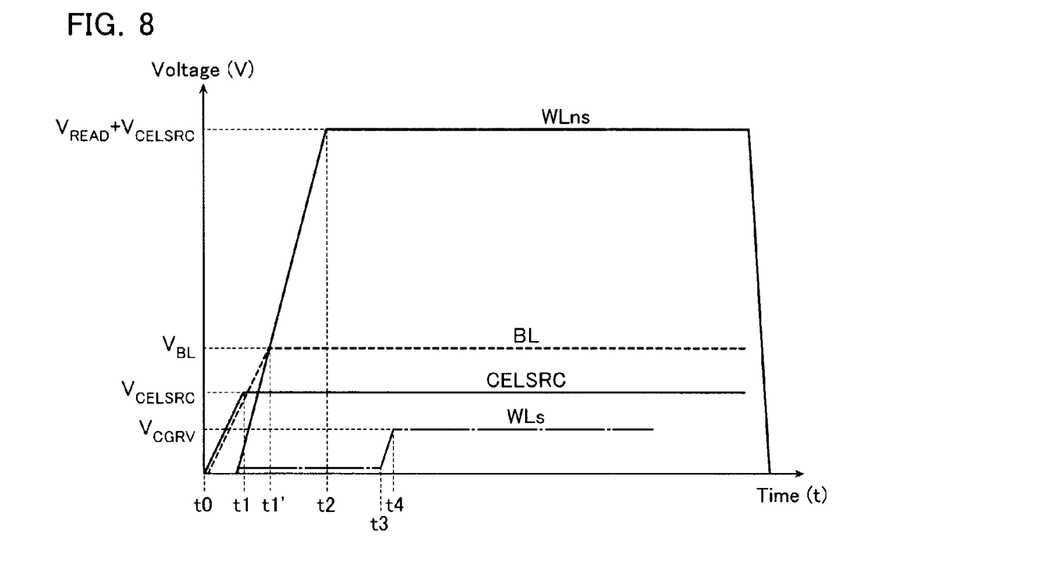
FIG. 8 is a timing chart showing a read operation in a NAND cell type flash memory of another modified example of the first embodiment.

A NAND cell type flash memory in another modified example of the first embodiment is described with reference to FIG. 8. A memory configuration is similar to that of the first embodiment. In this modified example, timing at which a voltage of the bit line BL begins to be applied differs from in the first embodiment.

The control circuit 10 controls the drivers 2', 4, 5, and 6 to begin applying a voltage also to the bit line BL almost simultaneously to beginning applying a voltage to the unselected word lines WLns at time t1. Subsequently, the potential of the bit line BL is raised to the voltage $V_{BL}$ at time t1' between time t1 and time t2. Subsequent operation is similar to that in the first embodiment.

In the other modified example of the first embodiment, similar advantages to those in the first embodiment can be obtained. Furthermore, by charging the bit line BL in advance, the read operation may be performed as soon as the selected word line WLs is applied with the voltage $V_{CGRV}$. Even if charging operation of the bit line in the block BLK take a long time, the operation in the present example allows time for the read operation to be reduced.

Second Embodiment

First, a NAND cell type flash memory in a second embodiment is described with reference to FIG. 9. A memory configuration is similar to that of the first embodiment. In this embodiment, timing at which a voltage of the source line CELSRC begins to be applied differs from in the first embodiment.

Figure 9:
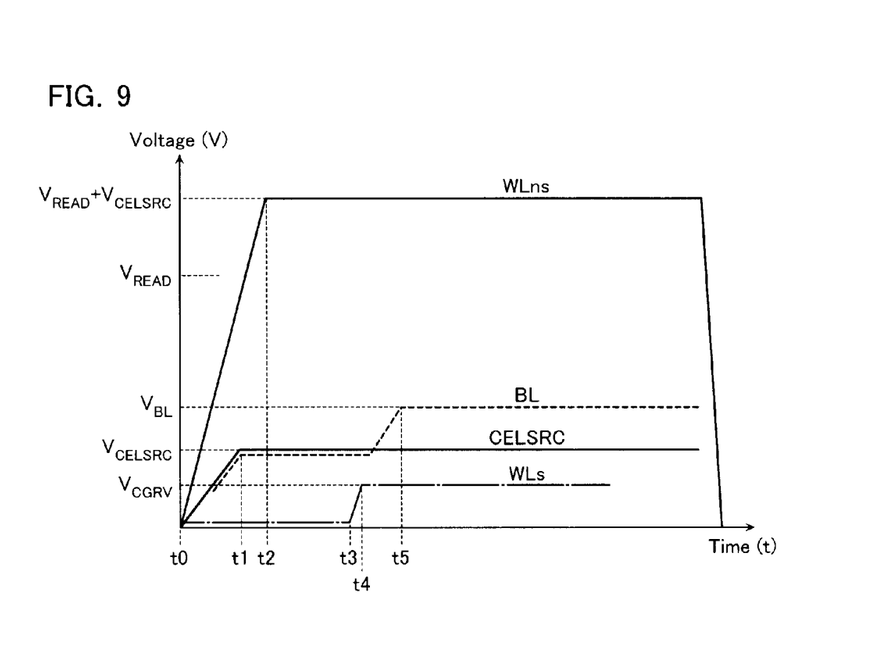
FIG. 9 is a timing chart showing a read operation in a NAND cell type flash memory of a second embodiment.

As shown in FIG. 9, in this embodiment, the control circuit 10 controls the drivers 2', 4, 5, and 6 to control such that the potential of the source line CELSRC begins to rise almost simultaneously to time t0 when a voltage of the unselected word lines WLns begins to be applied. Subsequently, the potential of the source line CELSRC reaches the voltage $V_{CELSRC}$ at time t1.

Now, the source line CELSRC has a parasitic capacitance which is large compared to the word lines WL, hence a gradient of a voltage rise curve of the word lines WL is steeper than a gradient of a voltage rise curve of the source line CELSRC. Now, time t1 is preferably earlier than time t2. This is because stress applied to the unselected word lines WLns is lowered.

In addition, a spike operation may also be performed on the selected word line WLs similarly to in the modified example of the first embodiment.

This second embodiment has similar advantages to those of the first embodiment. Furthermore, times when voltages of the source line CELSRC and the unselected word lines WLns begin to be applied are almost simultaneous, hence time required for the read operation can be further reduced.

Third Embodiment

Figure 10:
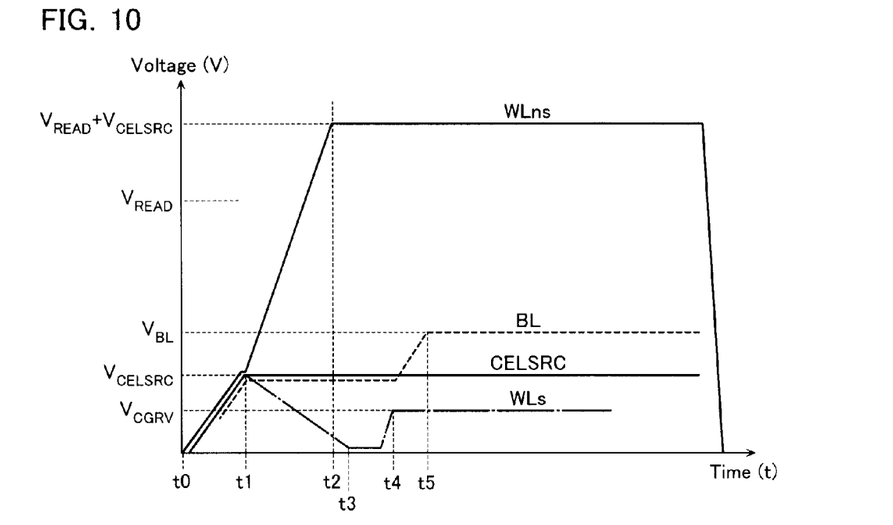
FIG. 10 is a timing chart showing a read operation in a NAND cell type flash memory of a third embodiment.

First, a NAND cell type flash memory in a third embodiment is described with reference to FIG. 10. A memory configuration is similar to that of the first embodiment. This embodiment differs from the previous embodiments in having gradients of rise in voltage of the source line CELSRC and the unselected word lines WLns that are substantially the same.

In this embodiment, the control circuit 10 controls the drivers 2', 4, 5, and 6 to begin raising of the potential of the source line CELSRC and the unselected word lines WLns with a substantially identical gradient from time t0. For example, supply of voltages to the source line CELSRC, the unselected word lines WLns, and the selected word line WLs is performed using the same boost circuit CP (power supply circuit) in the voltage generating circuit 7. As a result, the unselected word lines WLns and the selected word line WLs are each once charged to the voltage $V_{CELSRC}$. Note that regarding the selected word line WLs, it is also possible to perform similar control to that in FIG. 5A, without performing control to charge to the voltage $V_{CELSRC}$.

When the potential of the source line CELSRC, the unselected word lines WLns, and the selected word line WLs reach the voltage $V_{CELSRC}$ at time t1, the potential of the source line CELSRC is then kept constant, while the unselected word lines WLns are changed similarly to in the first embodiment. In addition, the potential of the selected word line WLs is once lowered to 0 V, then raised again to the voltage $V_{CGRV}$ at time t4.

In this embodiment, the gradient of rise in voltage of the unselected word lines WLns becomes steeper at time t1 and after. As a result, the read operation can be speeded up. In addition, this embodiment causes a potential difference between the control gates of memory cells M and the well SW to be maintained at about 0 at time t1 and before. Therefore, unnecessary voltage application to the memory cells M can be avoided and possibility of read disturb occurring can be suppressed even more.

In addition, due to supply of voltages to the source line CELSRC, the unselected word lines WLns, and the selected word line WLs being performed using an identical boost circuit CP, rise speed of voltages of the unselected word lines WLns and the selected word line WLs can be matched to that of the source line CELSRC between time t0 and time t1. This enables the voltage stress $V_{stress}$ applied to the unselected memory cells Mns to be reduced even more.

Moreover, since a potential difference is not generated between the selected word line WLs and the unselected word lines WLns between time t0 and time t1, parasitic capacitance between the selected word line WLs and the unselected word lines WLns does not influence the operation. Then, power consumption is also suppressed, and the operation can be speeded up.

In addition, a spike operation may also be performed, similarly to in the modified example of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. For example, the above-described embodiments were explained taking the read operation as an example. However, the operation in the above-described embodiments may also be applied as is to a verify operation.

What is claimed is:

1. A nonvolatile semiconductor memory device, comprising:
   a semiconductor layer;
   a memory cell array having memory strings, each of the memory strings having a plurality of memory cells connected in series, each of the memory cells including a charge accumulation layer formed on the semiconductor layer via a gate insulating film and a control gate formed on the charge accumulation layer via an inter-gate insulating film;
   word lines connected to the control gates;
   bit lines electrically connected to one ends of the memory strings;
   a source line electrically connected to the other ends of the memory strings; and
   a control circuit configured to control a voltage applied to the semiconductor layer, the control gates, the bit lines, and the source line,
   when executing a read operation,
   the control circuit being operative to begin application of a first voltage to the source line at a first time, the first voltage having a positive value, and
   begin application of a second voltage to at least one of unselected word lines at the first time or thereafter, the unselected word lines being the word lines connected to unselected memory cells which are the memory cells other than a selected memory cell selected from among the plurality of memory cells, the second voltage setting the memory cells to a conductive state regardless of retained data of the memory cells.

2. The nonvolatile semiconductor memory device according to claim 1, wherein
   the control circuit is configured to begin raising of a potential of the source line and the unselected word lines with the same gradient, thereby causing the potential of the source line to reach the first voltage and a potential of the unselected word lines to continue to raise at the first time, and causing the potential of the unselected word lines to reach the second voltage at a time after the first time.

3. The nonvolatile semiconductor memory device according to claim 2, wherein
   the control circuit is configured to supply a voltage to the word lines and the source line using an identical power supply circuit until the potential of the source line reaches the first voltage.

4. The nonvolatile semiconductor memory device according to claim 1, wherein
   the control circuit is configured to raise a potential of the source line with a first gradient from a second time earlier than the first time and raise a potential of the unselected word lines with a second gradient steeper than the first gradient.

5. The nonvolatile semiconductor memory device according to claim 1, wherein the control circuit is configured to begin raising of a potential of the source line from a fourth time earlier than the first time, and the control circuit is configured to begin raising of a potential of the unselected word lines from a third time later than the fourth time.

6. The nonvolatile semiconductor memory device according to claim 1, wherein
the control circuit is configured to, when executing the read operation, apply to the semiconductor layer a third voltage having a positive value and being equal to or less than the first voltage.

7. The nonvolatile semiconductor memory device according to claim 1, wherein
the control circuit is configured to, at a fifth time later than the second time, apply a read voltage to the selected word line connected to the selected memory cell, and
the control circuit is configured to, at a sixth time later than the fifth time, apply a fourth voltage higher than the first voltage to the bit lines.

8. The nonvolatile semiconductor memory device according to claim 1, wherein
the control circuit is configured to, at a fifth time later than the second time, apply a read voltage to the selected word line connected to the selected memory cell, and
the control circuit is configured to, at a seventh time between the first time and the fifth time, apply a fourth voltage higher than the first voltage to the bit lines.

9. A nonvolatile semiconductor memory device, comprising:
a semiconductor layer;
a memory cell array having memory strings, each of the memory strings having a plurality of memory cells connected in series, each of the memory cells including a charge accumulation layer formed on the semiconductor layer and a control gate;
word lines connected to the control gates;
bit lines electrically connected to one ends of the memory strings;
a source line electrically connected to the other ends of the memory strings; and
a control circuit configured to control a voltage applied to the semiconductor layer, the control gates, the bit lines, and the source line,
when executing a read operation or a verify operation,
the control circuit being operative to begin application of a first voltage to the source line, at a first time, the first voltage having a positive value,
begin application of a second voltage to at least one of unselected word lines at the first time or thereafter, the unselected word lines being the word lines connected to unselected memory cells which are the memory cells other than a selected memory cell selected from among the plurality of memory cells, the second voltage being larger than the first voltage.

10. The nonvolatile semiconductor memory device according to claim 9, wherein
the control circuit executes a spike operation at the first time or thereafter, the spike operation being an operation of applying a spike voltage of not less than the first voltage to a selected word line and then discharging, the selected word line being the word line connected to the selected memory cell.

11. The nonvolatile semiconductor memory device according to claim 9, wherein
the control circuit is configured to begin raising of a potential of the source line and the unselected word lines with the same gradient, thereby causing the potential of the unselected word lines to reach the second voltage at a time after the first time.

12. The nonvolatile semiconductor memory device according to claim 9, wherein
the control circuit is configured to supply a voltage to the word lines and the source line using an identical power supply circuit until the potential of the source line reaches the first voltage.

13. The nonvolatile semiconductor memory device according to claim 9, wherein
the control circuit is configured to raise a potential of the source line with a first gradient from a second time earlier than the first time and raise a potential of the unselected word lines with a second gradient steeper than the first gradient.

14. The nonvolatile semiconductor memory device according to claim 9, wherein
the control circuit is configured to begin raising of a potential of the source line from a fourth time earlier than the first time, and
the control circuit is configured to begin raising of a potential of the unselected word lines from a third time later than the fourth time.

15. The nonvolatile semiconductor memory device according to claim 9, wherein
the control circuit is configured to, when executing the read operation, apply to the semiconductor layer a third voltage having a positive value and being equal to or less than the first voltage.

* * * * *